United States Patent [19]
Su

[11] Patent Number: 5,156,993
[45] Date of Patent: Oct. 20, 1992

[54] FABRICATING A MEMORY CELL WITH AN IMPROVED CAPACITOR

[75] Inventor: Wen-Doe Su, Yun Lin, Taiwan

[73] Assignee: Industrial Technology Research Institute, Chutung, Taiwan

[21] Appl. No.: 568,945

[22] Filed: Aug. 17, 1990

[51] Int. Cl.$^5$ .............................................. H01L 21/70
[52] U.S. Cl. ........................................ 437/52; 437/47;
 437/48; 437/60; 437/203; 437/228; 437/233;
 437/919
[58] Field of Search ...................... 437/38, 47, 48, 52,
 437/60, 191, 193, 195, 203, 228, 233, 235, 919;
 357/23.6; 148/DIG. 50; 156/643

[56] References Cited
U.S. PATENT DOCUMENTS 4,894,696  1/1990  Takeda et al. ..................... 357/23.6
4,921,816  5/1990  Ino ................................... 357/23.6

FOREIGN PATENT DOCUMENTS 0067955  4/1986  Japan ................................ 437/52
0137863  6/1987  Japan .
0248248 10/1987  Japan .
0209158  8/1988  Japan .
0280351 11/1989  Japan .
0307257 12/1989  Japan .
 138207 10/1984  United Kingdom .

Primary Examiner—Tom Thomas
Attorney, Agent, or Firm—George O. Saile

[57] ABSTRACT

A process for producing a random access memory cell having an improved capacitor structure that thereby permits greater integration. The capacitor is a merged combination of a stacked trench and a stacked capacitor which has at least two plates separated by a dielectric layer. The plates are formed of polysilicon and extend partially over the gate region, over the source region, over the sidewalls and bottom of a trench, and partially over the field oxide.

15 Claims, 6 Drawing Sheets

FABRICATING A MEMORY CELL WITH AN IMPROVED CAPACITOR

BACKGROUND OF THE INVENTION (1) Field of the Invention

The invention generally relates to integrated circuit devices, more specially devices each with a stacked capacitor overlaying the regions of transistor electrode, trench, and field oxide, and still more specially to a process for producing a charge storage capacitor for a DRAM (dynamic random access memory) that has a large capacity and occupies less space on the device.

(2) Description of the Prior Art

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, a decrease in storage capacitance, which results from the reduction in cell size, leads to draw backs, such as a lowering s/d ratio and undesirable signal problems in terms of reliability. In order to achieve the desired higher level of integration, it requires the technology to keep almost the same storage capacitance on a greatly reduced cell area.

Efforts to maintain or increase the storage capacitance in memory cells with greater packing densities are evident in U.S. Pat. No. 4,742,018, which discloses a stacked capacitor. The publication "Stacked Capacitor Cells for High-Density Dynamic RAMs" by Watanabe et al, page 600, IEDM, 1988, shows a stacked capacitor and a process for making it that is suited for use in 16 Megabit dynamic RAMs. Another approach to achieve sufficient capacitance in high density memories is the use of a stacked trench capacitor cell, as disclosed in "Process Technologies for High Density High Speed 16 Megabit Dynamic RAMs" by Horiguchi et all, page 324, IEDM, 1987.

It is well known that in the art of integrated circuit device manufacture, one of the primary goals is increasing the number of device that can be placed into a given unit space on the semiconductor chip. As the traditional fabrication process begin to approach the limit of reduction, considerable attention has been applied to forming device elements on over and above the wafer to take advantage of extra versatility of third dimension.

One of the successful vertically oriented integrated circuit devices is the stacked capacitor. Briefly, a stacked capacitor is formed by forming the stacked capacitor structures laying over the gate electrode on active and field oxide regions and diffusion region.

One such stacked capacitor for a dynamic random access memory (DRAM) cell has two transistors with word lines and as the gates of transistors. The memory bit line connects to one of the source/drain regions and the other source/drain region of the transistor is tied to one plate of the capacitor. The capacitor is formed by polysilicon plate, stacked dielectric and polysilicon node laying over the transistor gates and one of the diffusion region of the transistor. The capacitor is extended to cover the work line in order to increase the capacitance of the stacked cell. The limitation of the stacked capacitor is that the polysilicon plate and polysilicon node can not extend too much over the field region due to the limitation of patterning resolution, typically, about 0.5 micrometers.

In order to increase the capacitance of stacked capacitor within the limited chip area, the step height of capacitor over transistor gate is increased by additional deposition and patterning of polysilicon as shown in FIG. 3, disclosed by Hidenhire Watanabe et al, p 600 to 603, IEDM 1988.

Not withstanding, the aforedescribed capacitor structure, there is a need for even greater capacitance for a given space in order to achieve even greater packing densities, and improve the field of DRAMs and other device.

SUMMARY OF THE INVENTION

Accordingly, it is a primary object of the invention to provide a process for producing a memory cell with a greater capacitance for unit area.

Another object is to provide a memory cell structure with an improved capacitor that is capable of greater integration.

Yet another object is to provide a process for providing a merged stacked trench and stacked capacitor in combination with an FET.

The innvention is a process for producing a dynamic random access memory cell with a merged stacked trench and stacked capacitor by (1) forming a relatively thick field oxide on a silicon substrate, leaving an area for devices, (2) forming a trench in the device area, (3) forming an insulating layer on the surface of the trench, (4) depositing a relatively thick layer of polysilicon on the substrate surface, (5) removing portions of the first polysilicon layer leaving a portion for the gate in the device area and a portion over the field oxide, (6) forming source and drain regions in the device, (7) depositing a thin blanket silicon oxide layer over the substrate and forming an opening over the source region, (8) forming a second doped polysilicon layer over the surface of the substrate, including the surfaces of the trench, (9) forming a thin insulating layer over the surface of the second polysilicon layer, (10) forming a third doped polysilicon layer over the thin insulating layer, the third polysilicon layer being a second capacitor plate, and the second polysilicon layer being a first capacitor plate.

DETAILED DESCRIPTION OF THE INVENTION

Preferred embodiments of the invention will be described in detail with reference to the accompanying drawings.

The figures of the drawings show the structure of the single cell. It is understoood that the process can be used in the fabrication of CMOS devices wherein cells are formed in opposite type impurity regions, as is well known in the art. The forming of the impurity wells to receive the cells is well known and will not be described.

Figure 1:
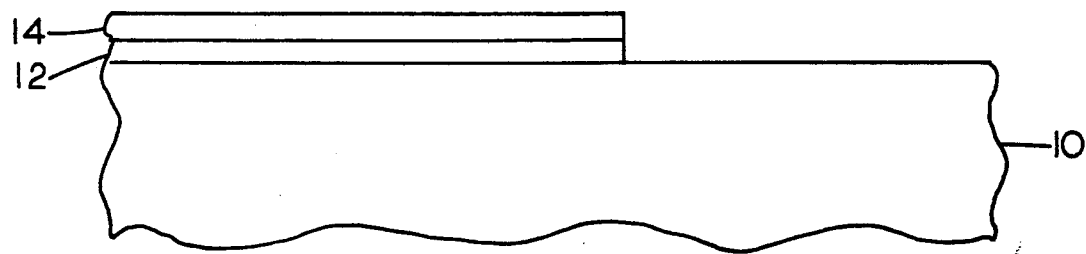
FIGS. 1 through 16 is a sequence of cross sectional views in broken section, illustrating device structures at various stages that a first embodiment of the process of the invention.
Figure 2:
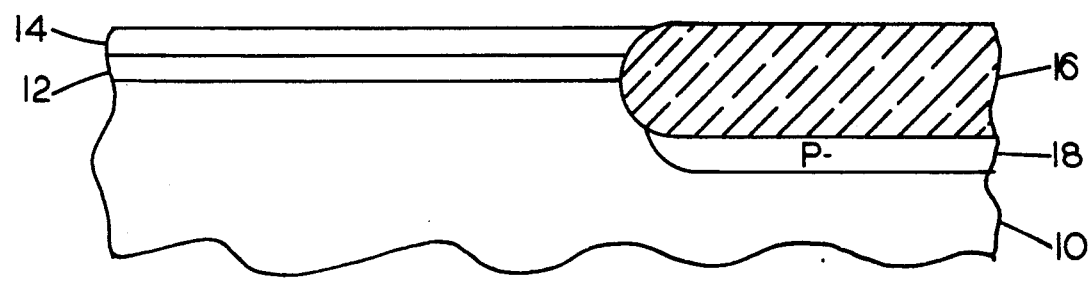
Figure 3:
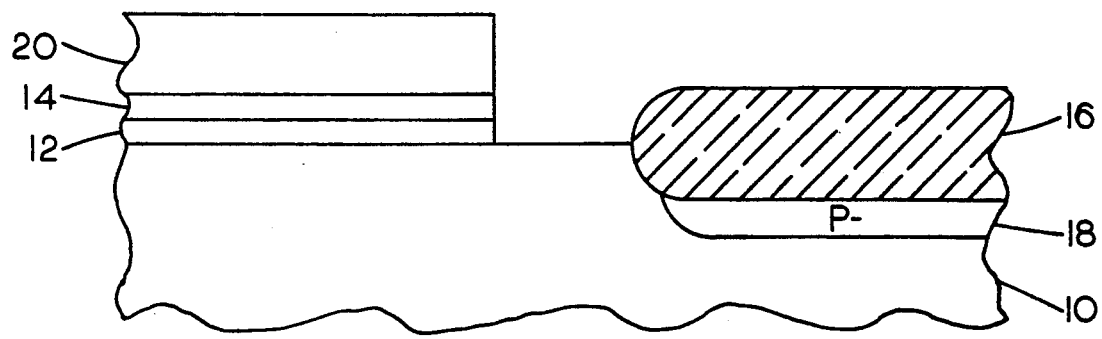
Figure 4:
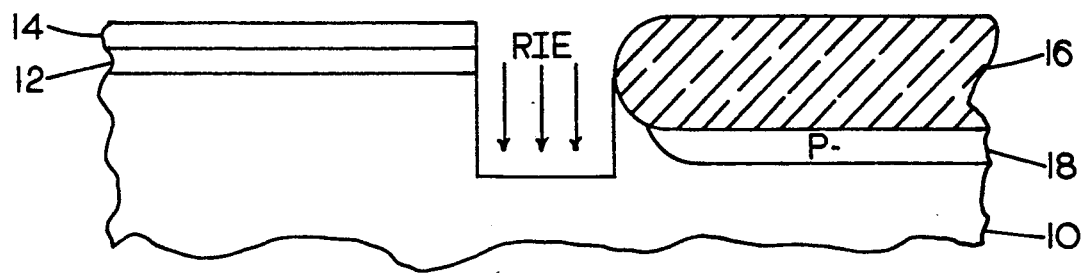
Figure 5:
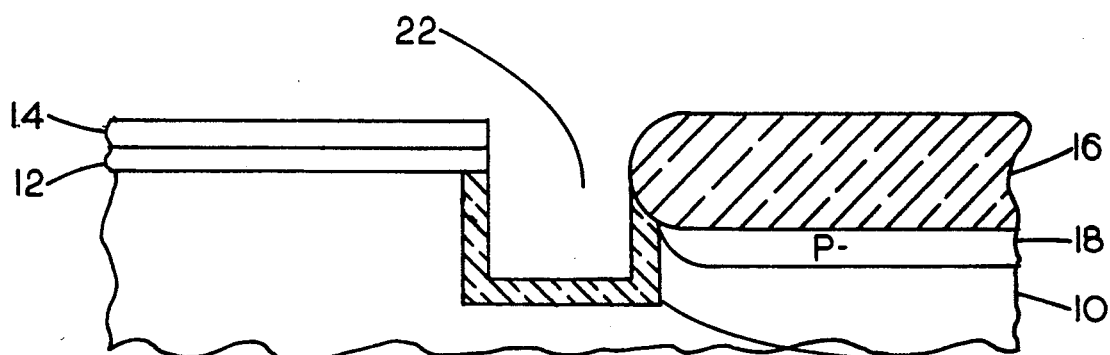
Figure 6:
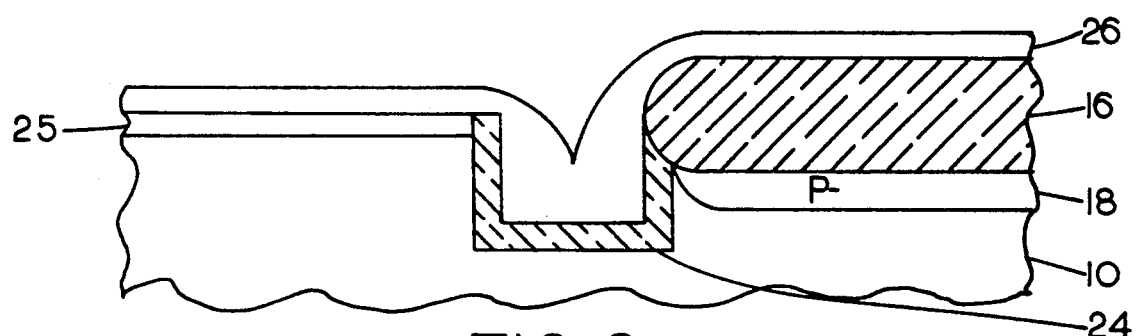
Figure 7:
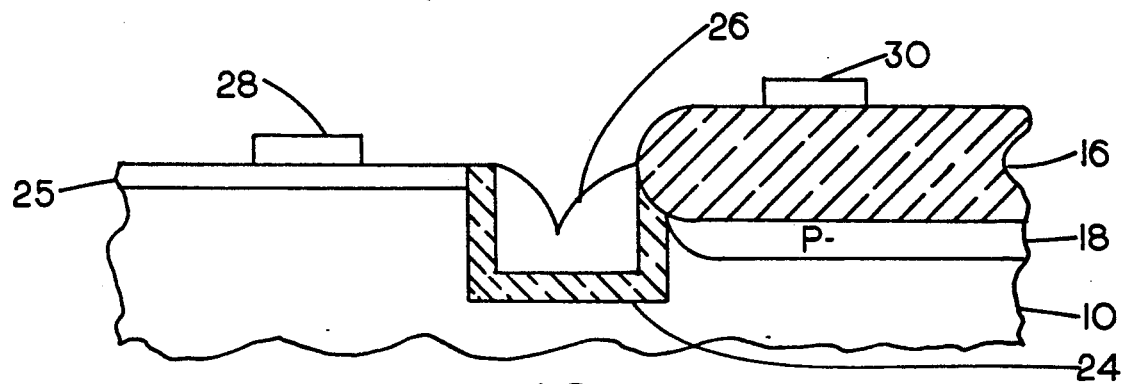
Figure 8:
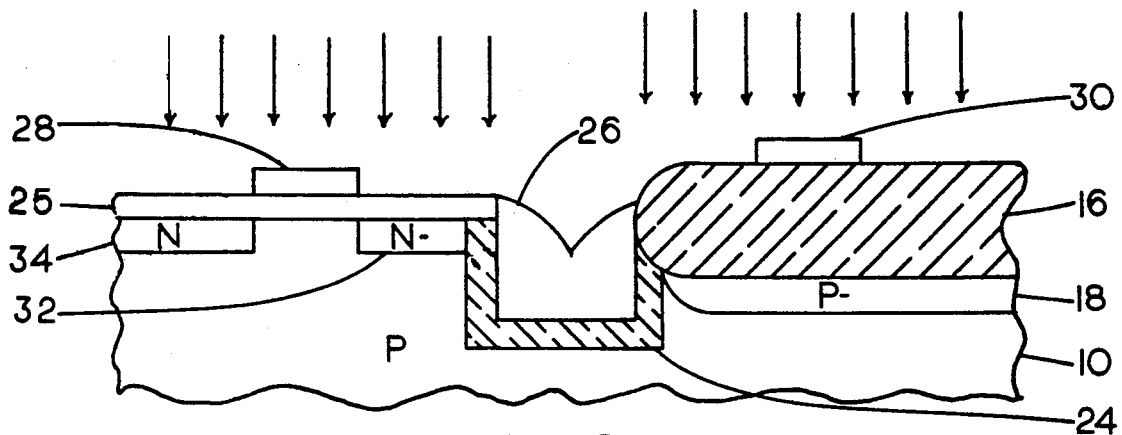
Figure 9:
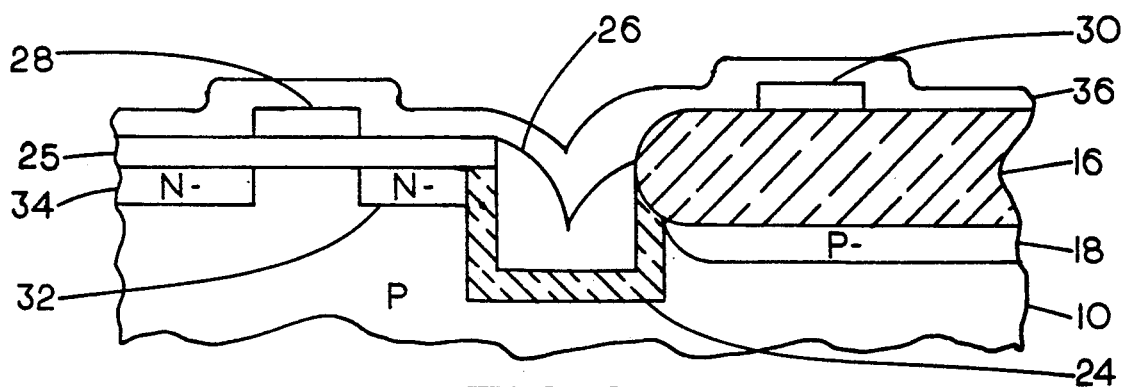
Figure 10:
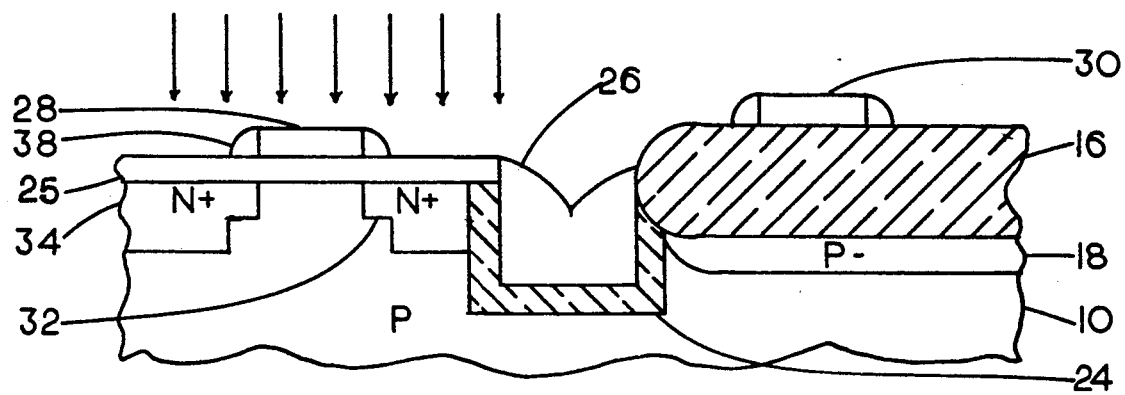

Referring to FIG. 1, a layer 12 of silicon oxide is formed by exposing a silicon substrate 10 and oxidizing atmosphere. A layer 14 of silicon nitride is deposited over layer 12. The layer combination is patterned, using conventional photolithographic and etching techniques to expose areas that will constitute field areas. The layer combination is retained over device areas. As shown in FIG. 2 a thick silicon dioxide layer 16 is formed by exposing the substrate to an oxidizing environment. It is desirable to initially introduce an impurity, such as boron, into the substrate prior to forming layer 16. This will result in a region 18, which will prevent the formation of inversion layers under the oxide 16. As shown in FIG. 3, a photoresist layer 20 is formed on layer 14 to define the trench structure. The exposed portions of layers 12 and 14 are removed, and the trench 22 is etched in substrate 10, as shown in FIG. 4. The trench 22 is preferably formed by reactive ion etching techniques, which are well known in the art. This etching will produce substantially vertical sidewalls, which is desirable. The trench is preferably 1 micrometer to 4 micrometers in depth, and 0.6 micrometer to 1.0 micrometer in width. However, the trench can be of any suitable depth and width to suit the particular application. As shown in FIG. 5 an oxide layer 24 is formed on the walls of trench 22. Layer 24 is preferably formed by exposing the substrate to an oxidizing atmosphere. The layer preferably has a thickness of about 500 to 2000 Angstroms. As shown in FIG. 6 Silicon nitride layer 14 and silicon dioxide layer 12, are removed and a first polysilicon layer 26 is deposited on substrate 10 after the gate oxide 25 is grown. Subsequently, layer 26 is masked and the exposed portions removed, leaving gate 28 and portion 30. A portion of layer 26 will normally remain in trench 22. Layer 26 has a thickness of about 2000 to 5000 Angstroms. As shown in FIG. 8, the source 32 and drain 34 regions are formed in substrate by ion implantation techniques. Preferably a graded junction is provided by implanting the selected ion at a low dosage and at a low acceleration voltage, using gate layer 28 to mask the channel. Subsequently a silicon dioxide layer 36 is deposited by chemical vapor techniques and as shown in FIG. 9 the layer 36 is exposed to reactive ion etching to result in the structure shown in FIG. 10, i.e. blocking portions 38 on the vertical edges of gate 28. A second ion implantation at a higher dosage and higher implantation voltage is performed, resulting in graded source and drain regions 32 and 34. The implantation also includes impurity ions into gate 28 making it conductive.

Figure 11:
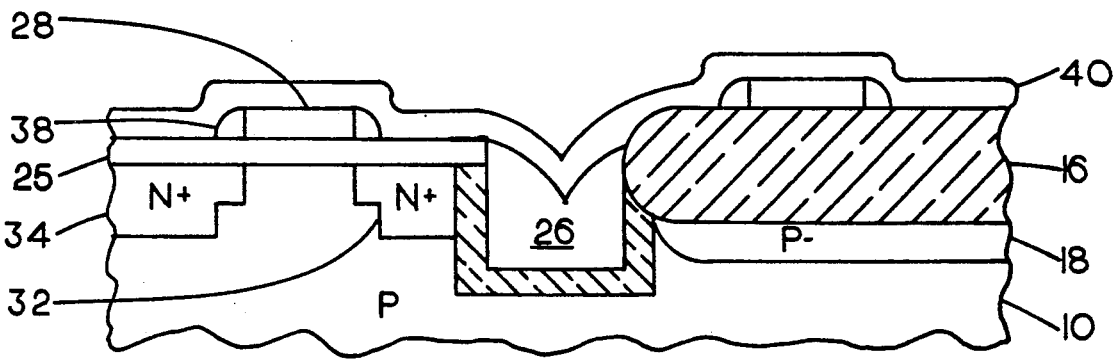
Figure 12:
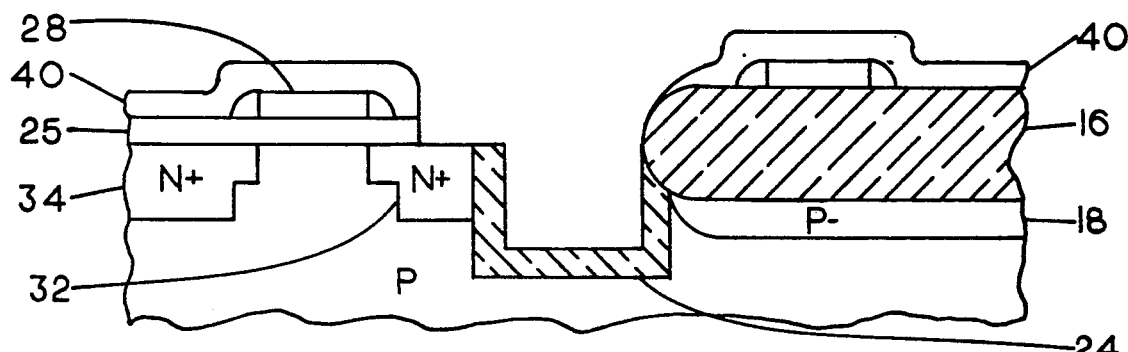
Figure 13:
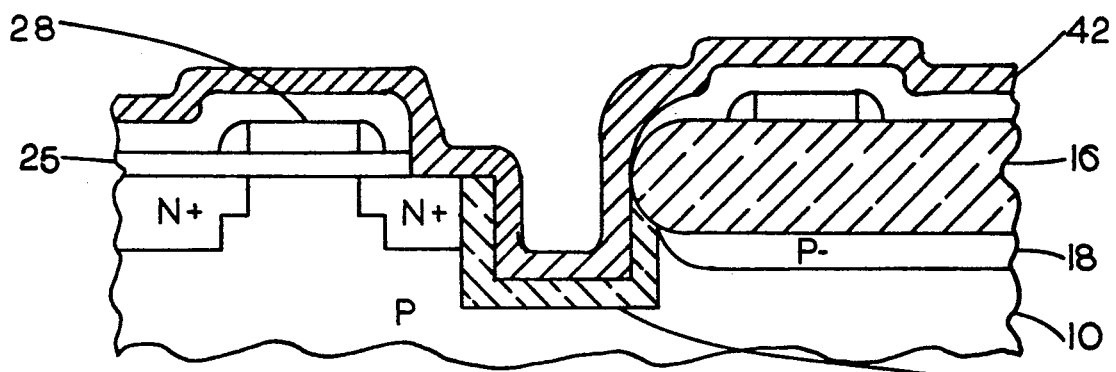
Figure 14:
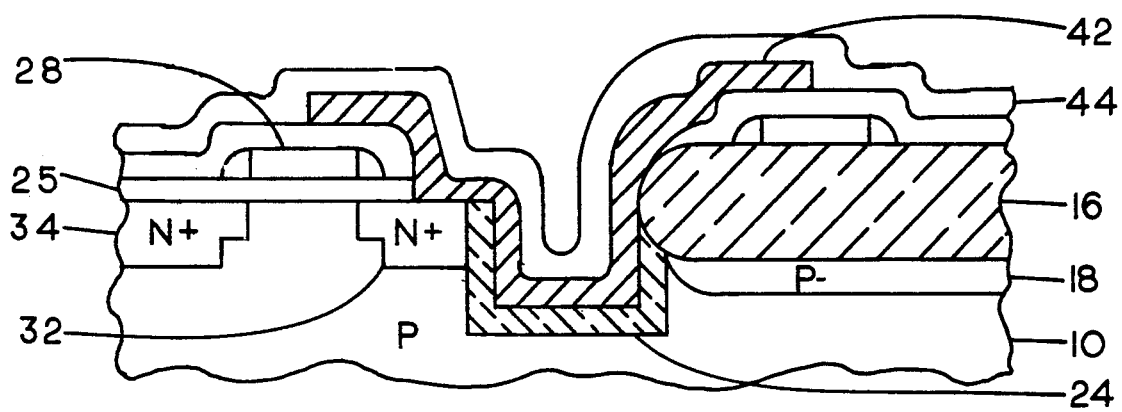
Figure 15:
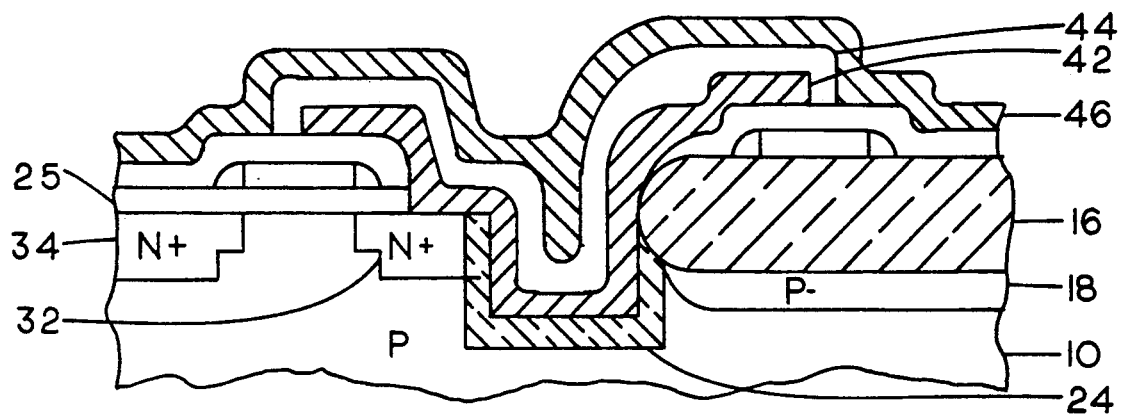
Figure 16:
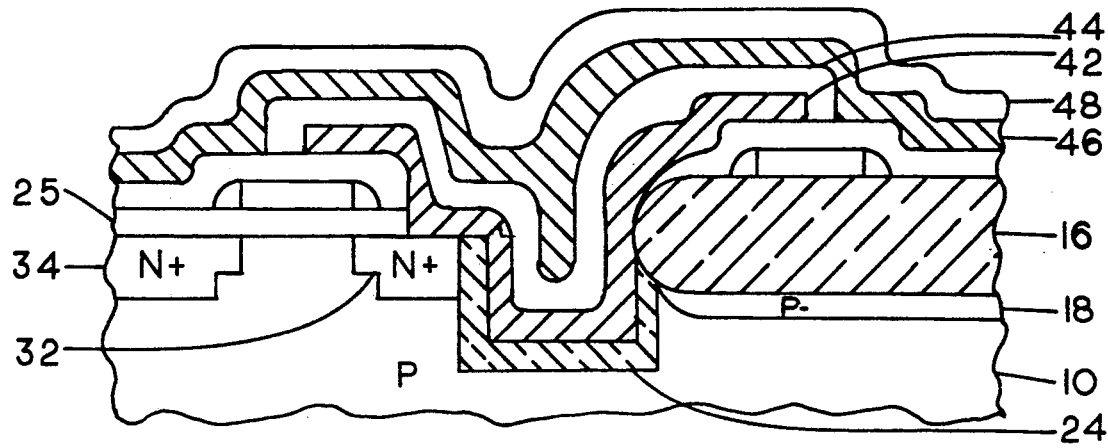

An oxide layer 40 is then deposited over the surface of substrate 10, as indicated in FIG. 11. The layer has a theickness of about 1000 to 5000 Angstroms and is deposited by low temperature techniques such as the decomposition of Tetraethoxysilane (TEOS). The layer 40 is preferably silicon dioxide, but could also be doped TEOS. etc. An area over the source region 32 and over layer 26 in the trench is removed, as shown in FIG. 12. Layer 40 is then used as a mask to remove the remaining portion of layer 26 in the trench. A polysilicon layer is then deposited over the surface of substrate 10 as indicated in FIG. 13. The layer 42 has a thickness of about 500 to 3000 Angstroms, more preferably from 1000 to 2000 Angstroms, and will serve as an electrode of the finished stacked trench and stacked capacitor. Layer 42 is patterned, using conventional photoresist and etching techniques to limit it to basically the area shown in FIG. 14, i.e., in the trench, over region 30, partially over gate 28, and in electrical contact with source region 32. Surface insulating layer 44 is formed by exposing layer 42 to an oxidizing environment. Layer 44 has a thickness of about 50 to 200 Angstroms, and serves as the dielectric for the capacitor. As shown in FIG. 15, a third polysilicon layer 46 is deposited over layer 44. Layer 46 serves as the second electrode of the capacitor. Layer 42 and 46 have incorporated therein an impurity to make them conductive. The impurity can be introduced by an implantation step, or introduced as the layers are deposited. As shown in FIG. 16, a blanket layer 48 of silicon dioxide is deposited over the surface of substrate 10, using low temperature deposition technique. Layer 48 has a thickness of about 200 to 1000 Angstroms. Therefore the conventional conductive metallurgy is formed to complete the RAM device or other applications as is well known in the art. It is understood that the disclosed structure is a adopted to be used with both P and N channel device, or a combination thereof, as in CMOS.

Figure 17:
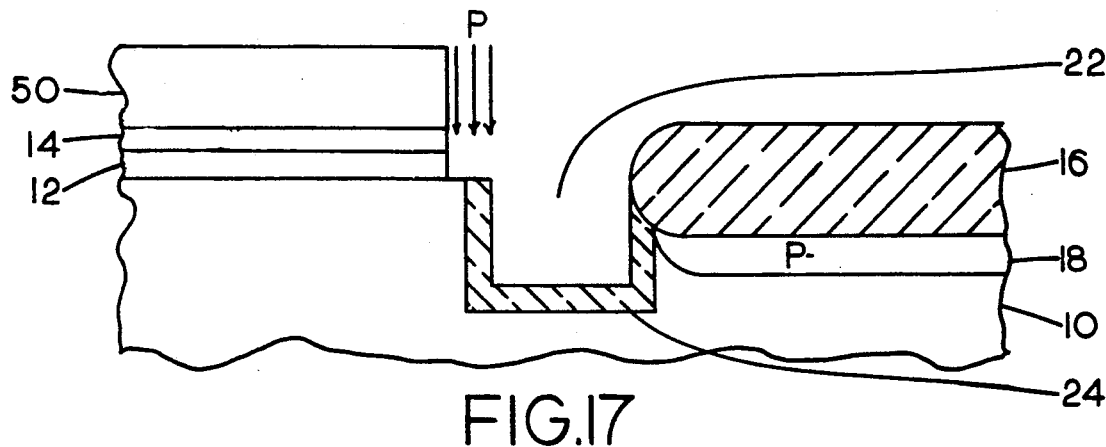
FIGS. 17 through 19 is a series of cross section views that, in combination with FIGS. 1 through 16, illustrate a second embodiment of the invention.
Figure 18:
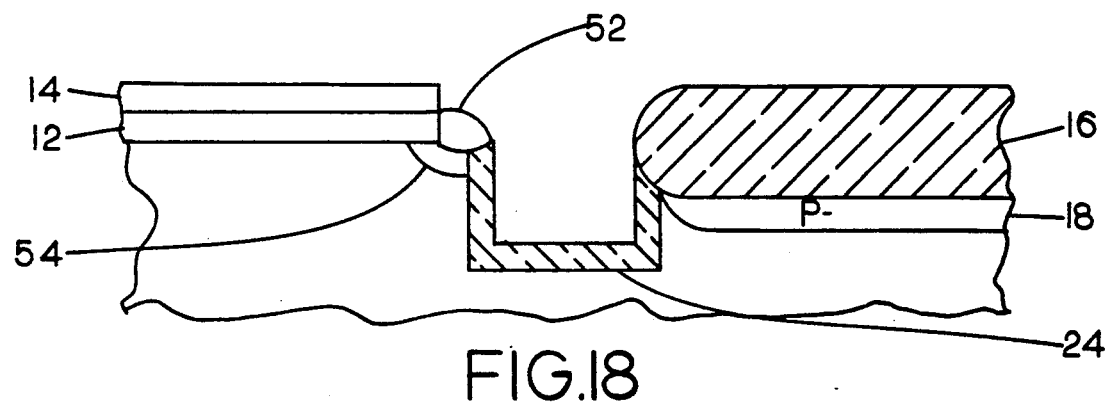
Figure 19:
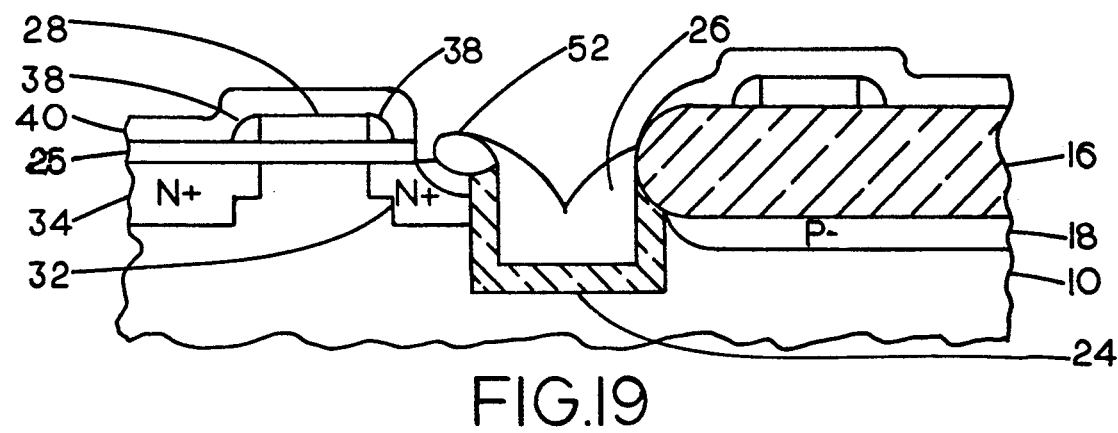

A second embodiment of the invention is shown in FIG. 17 through 19. The steps shown in FIG. 1 through 5 result in through 19. The steps shown in FIG. 1 through 5 result in the device structure in FIG. 17. A photoresist layer 50 is deposited, exposed and developed to expose a portion of layers 12 and 14 at the edge of trench 22, as shown in FIG. 17. The exposed portions of layers 12 and 14 are removed, and the device exposed to an oxidizing environment which results in silicon oxide layer 52, which overlies the exposed junction between layer 24 and substrate 10, as shown in FIG. 18. Region 54 under layer 52 can be provided by diffusing an implantation of suitable impurity prior to oxidation. The process steps illustrated in FIG. 6 through 11 are then performed on the device. The basic structure shown in FIG. 19 is the result upon completion of the steps of FIG. 6 through 11. A photoresist layer 40 is deposited, exposed and developed to expose the region over the source region 32 and trench. The exposed area of layer 25 is removed, and subsequently the polysilicon layer 26 remaining in the trench is removed. The process then proceeds with the steps shown in FIG. 13 through 16 as described above.

The advantage of the second embodiment of the invention is the further reduction of gated diode leakage at storage node due to the introductions of region 52.

While the invention has been particularly shown and described with reference to the preferred embodiments thereof, it is will be understood by those skilled in the art that various changes and modifications can be made in the invention without departing from the spirit and scope of the invention.

What is claimed is:

1. A process for producing a dynamic random access memory cell having a merged stacked trench and stacked capacitor comprising the steps of:
    (a) selectively forming field oxide areas on the surface of a semiconductor substrate while leaving device areas for fabrication of field effect devices,
    (b) forming trenches in said device areas adjacent the edges of said field oxide areas,
    (c) forming a first insulating layer on the surface of said trenches,
    (d) depositing a first layer of polysilicon on the surface of said substrate, including the sidewalls and bottom of said trench, of a thickness to substantially fill said trench, (e) removing portions of said first polysilicon layer but leaving portions thereof for the gate structure in said device area, portions over said field oxide, and portions in said trench, (f) forming source and drain regions in said device areas by masking and ion implantation techniques, utilizing said portions of said first polysilicon layer, for gate structure as a blocking mask, (g) depositing a second insulating layer of silicon oxide over said substrate and forming openings over as said source regions, and subsequently removing said portions of said first polysilicon layer in said trench.

(h) forming a second doped polysilicon layer over the surface of said substrate including the sidewalls and bottom of said trench and opening over said source region, said second polysilicon layer to serve as a first capacitor plate, (i) forming a third insulating layer over the surface of said second polysilicon layer, (j) forming a third doped polysilicon layer over said insulating layer, said third polysilicon layer to serve as a second capacitor plate, said resultant structure forming a memory cell with a coupled capacitor and a field effect transistor.

2. The process of claim 1 wherein a plurality of said field effect transistors and coupled capacitor structures forms a high density, high speed, dynamic random access memory device.

3. The process of claim 1 wherein individual P and N types regions are formed in said substrate, and said plurality of FETs and coupled capacitor structures are each associated with one of said regions to form complimentary metal over silicon devices.

4. The process of claim 1 wherein said trenches formed in said substrate each have a depth of between 1 to 4 micrometers and a width of between 0.6 to 1.0 micrometers, and the thickness of said first polysilicon layer is at least one-half of the width of said trench.

5. The process of claim 4 wherein said source and drain regions have a graded profile, formed by initially ion implanting at a low acceleration voltage, using said portions of said first polysilicon gate layer as a mask, and subsequently forming blocking mask portion of oxide in the vertical surfaces of said polysilicon portions and ion implanting with a higher dosage and a relatively low acceleration voltage.

6. The process of claim 1 wherein said first insulating layer on the surfaces of said trench is formed by exposing the surfaces thereof to an oxidizing environment, said resultant silicon dioxide layer having a thickness of 7. The process of claim 1 which further includes process steps to provide device structure to reduce gated diode leakage at the storage node and additionally comprising:

initially forming a masking layer to mask device surface regions prior to forming said field oxide areas, forming said field oxide areas by exposing the unmasked are to a highly oxidizing environment, removing portions of said masking layer, forming trenches by reactive ion etching through the resultant openings, forming a first insulating layer on the surfaces of said trenches, removing further portions of said masking layer over the top edges of the trenches and exposing the interface of the underlying device material and the first insulating layer on the trench surfaces, thermally oxidizing the resultant exposed device material to an oxidizing environment resulting in forming a fifth insulating layer of thermal oxide over said interface.

8. The process of claim 13 wherein said masking layer is a composite of an underlying layer of silicon dioxide and an overlying layer of silicon nitride.

9. The process of claim 1 wherein said first polysilicon layer has a thickness of between 2000 to 5000 Angstroms.

10. The process of claim 7 wherein said third polysilicon layer has thickness between 1000 to 3000 Angstroms.

11. The process of claim 6 wherein said second polysilicon layer has a thickness of between 1000 to 2000 Angstroms.

12. The process of claim 7 wherein said third insulating layer on said second polysilicon layer is formed by exposing said layer to an oxidizing environment, said insulating layer having a thickness of between 50 to 200 Angstroms.

13. The process of claim 9 wherein fourth insulating blanket layer is formed over said third polysilicon layer, said blanket layer having a thickness in the range of 200 to 1000 Angstroms.

14. The process of claim 11 wherein said fourth insulating blanket layer is of silicon dioxide, formed by using low temperature deposition techniques.

15. The method of claim 1 wherein said field oxide regions are formed by initially masking the substrate with a composite layer of a lower layer of $SiO_2$ and an overlay layer of $Si_3N_4$ over the device areas, oxidizing the substrate to form oxide regions in the unmasked areas, and subsequently removing said composite layer following the forming of said first insulating layer, and forming a gate insulation layer on the surface of said device area.

* * * * *